United States Patent
Lin et al.

(10) Patent No.: US 8,772,928 B2
(45) Date of Patent: Jul. 8, 2014

(54) INTEGRATED CIRCUIT CHIP WITH REDUCED IR DROP

(75) Inventors: Chih-Ching Lin, Hualien County (TW); Ya-Ting Chang, Taipei (TW); Chia-Lin Chuang, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 376 days.

(21) Appl. No.: 13/205,648

(22) Filed: Aug. 9, 2011

(65) Prior Publication Data

US 2013/0037934 A1    Feb. 14, 2013

(51) Int. Cl.
*H01L 23/48* (2006.01)

(52) U.S. Cl.
USPC .......................................................... 257/737

(58) Field of Classification Search
CPC ..................................................... H01L 23/48
USPC ............................................. 257/737, E23.01
See application file for complete search history.

(56) References Cited

U.S. PATENT DOCUMENTS

| | | | |
|---|---|---|---|
| 2009/0236637 A1* | 9/2009 | Ko et al. | 257/207 |
| 2009/0283904 A1* | 11/2009 | Ali et al. | 257/737 |
| 2013/0119557 A1* | 5/2013 | Or-Bach | 257/774 |

* cited by examiner

*Primary Examiner* — Walter H Swanson
(74) *Attorney, Agent, or Firm* — Winston Hsu; Scott Margo (57) ABSTRACT

An integrated circuit chip includes a power/ground interconnection network in a topmost metal layer over a semiconductor substrate and at least a bump pad on/over the power/ground interconnection network. The power/ground mesh interconnection network includes a first power/ground line connected to the bump pad and extending along a first direction, and a connection portion connected to the bump pad and extending along a second direction.

16 Claims, 7 Drawing Sheets

INTEGRATED CIRCUIT CHIP WITH REDUCED IR DROP

BACKGROUND OF THE INVENTION

1. Field of the Invention

The present invention relates generally to the field of semiconductor integrated circuit devices. More particularly, the present invention relates to an improved integrated circuit chip and its interconnection scheme that are capable of reducing IR drop over the chip.

2. Description of the Prior Art

In the processes for designing a large-scale integrated semiconductor circuit device, respective blocks of the device are generally designed in parallel to complement device characteristics with one another. During designing the large-scale device, the building-block type of method can be utilized, in which the circuit of the device is divided into a plurality of circuit blocks and each of the circuit blocks is thus designed at the same time. The overall design of the device is then carried out by integrating these constituent blocks.

An integrated circuit (IC) usually has a large number of circuit blocks and multiple levels of conductors are used to distribute power and signals from off the IC to the circuit blocks within the IC, between the circuit blocks, and between cells within each circuit block.

It is well known that the conductors can be formed by lithographically patterning a layer of conductive material to form conductive lines as viewed from above the IC substrate. The conductive layers with conductive lines formed therein are isolated by an insulating layer so that lines of one layer which cross another layer do not physically or electrically contact each other. When it is desired to electrically couple a conductive line formed in one layer to a conductive line formed in another layer, a conductive via can be formed extending through the insulating layer between the two conductors.

Typically, the topmost two or three levels of the interconnection metal layers are used for power and ground routing in an integrated circuit chip. Taking a 1P7M interconnection scheme for example, the topmost level of the interconnection metal layers, i.e., metal-7 or M7, and M6, i.e., the metal layer that is one level lower than M7, are both used to constitute a power/ground mesh-like network. In some cases, the aforesaid M7 metal layer may be a redistribution layer (RDL) and part of the M5 metal layer may also be used to form the power/ground mesh-like network.

Figure 1:
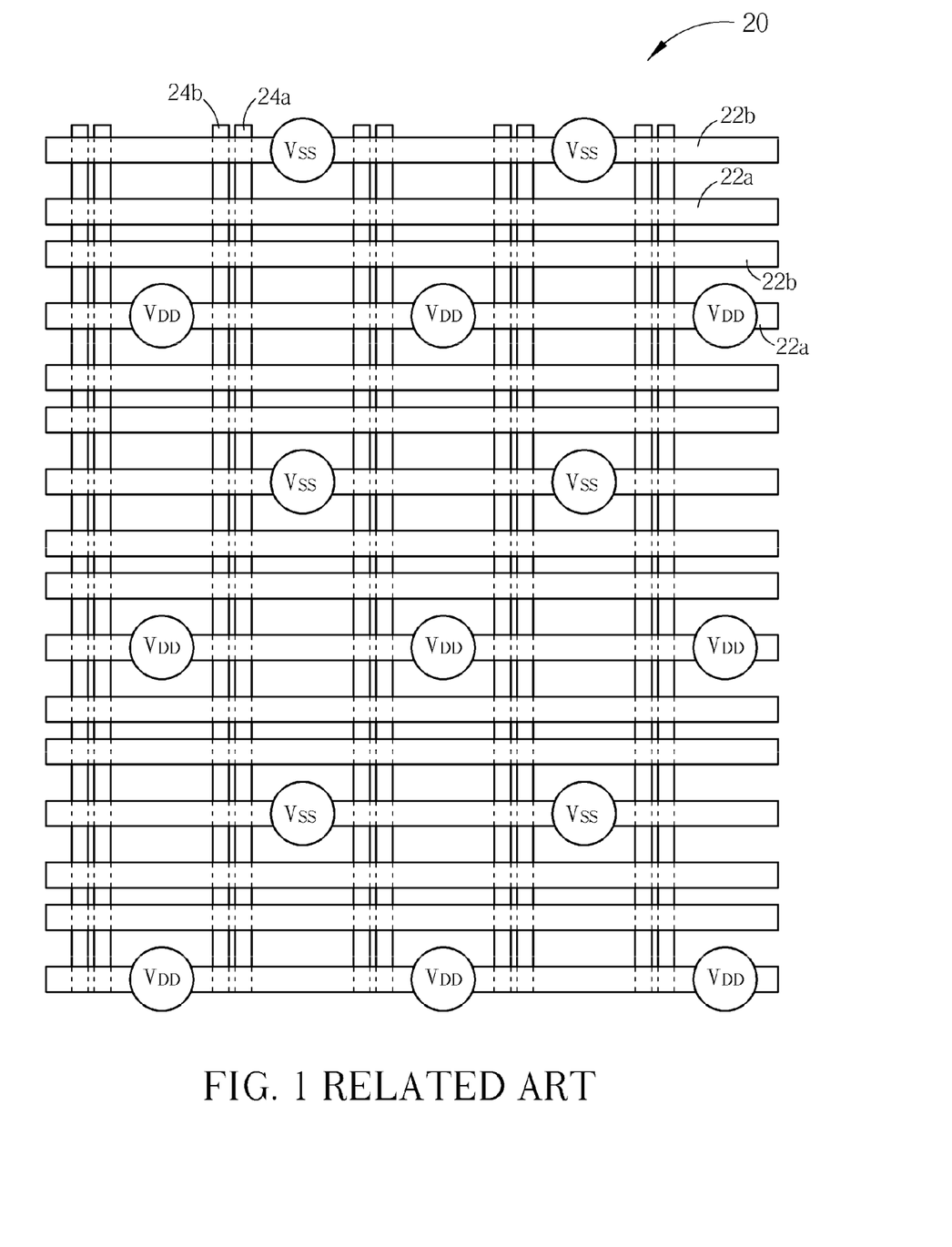
FIG. 1 is a schematic, partial plan view showing a conventional power/ground mesh-like network and staggered bumping sites in an IC chip.

FIG. 1 is a schematic, partial plan view showing a conventional power/ground mesh interconnection network and bumping sites in an IC chip having six levels of metal layers. The mesh interconnection network 20 consists of a plurality of horizontal power ($V_{DD}$) lines 22a and ground ($V_{SS}$) lines 22b, which may be fabricated in the RDL, and longitudinal power lines 24a and ground lines 24b, which may be fabricated in M6. The horizontal power lines 22a and ground lines 22b are parallel to one another. The longitudinal power lines 24a and ground lines 24b are parallel to one another. The horizontal power lines 22a and ground lines 22b are substantially orthogonal to the underlying power lines 24a and ground lines 24b. The $V_{DD}$ bumping sites and $V_{SS}$ bumping sites are disposed in a staggered manner. Through the mesh interconnection network 20 and respective via stacks (not shown), the power or ground signals are provided from respective power or ground rings to the cell level devices such as transistors or regions which are fabricated in or on the main surface of a semiconductor substrate (not shown) and are not equally spaced from the ring.

However, the prior approach induces high voltage drop (or IR drop), which results in increased power consumption and reduced signal timing speed. Besides, the conventional power/ground mesh-like network in the topmost two or three levels of the interconnection metal layers significantly limits the routing space for signal line in a chip. Therefore, there is a strong need in this industry to provide an improved power and ground routing for the integrated circuit chip that is capable of reducing the metal layer resistance, thus lowering the IR drop over a chip and improving the chip performance, and providing more space for signal routing.

SUMMARY OF THE INVENTION

It is one object of the invention to provide an improved power and ground routing scheme for the integrated circuit (IC) chips that is capable of reducing the IR drop and/or providing more space for signal routing.

According to one aspect of this invention, an integrated circuit chip includes a semiconductor substrate; a power/ground interconnection network in a topmost metal layer over the semiconductor substrate; and at least a bump pad on/over the power/ground interconnection network. The power/ground interconnection network includes a first power/ground line connected to the bump pad and extending along a first direction, and a connection portion connected to the bump pad and extending along a second direction.

According to another aspect of this invention, an integrated circuit chip includes a semiconductor substrate; a bump pad on or over a topmost metal layer on the semiconductor substrate; a first power/ground line in the topmost metal layer, connected to the bump pad and extending along a first direction; and at least an extension portion in the topmost metal layer, connected to the bump pad and extending along a second direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Throughout the specification and drawings, the symbol "Mn" refers to the topmost level of the metal layers fabricated in the integrated circuit chip, while "Mn−1" refers to the metal layer that is just one level lower than the topmost metal layer and so on, wherein, in some embodiments, n ranges between 5 and 8 but not limited thereto. The symbol "V" refers to the via or via plug between two adjacent conductive metal layers. For example, V5 refers to the via or via plug interconnecting M5 to M6.

The present invention pertains to an improved IC chip and its interconnection scheme that are capable of reducing IR drop over the chip and/or providing more space for signal routing. More specifically, the present invention provides a power/ground plane structure or power/ground interconnection network in an IC chip.

Figure 2:
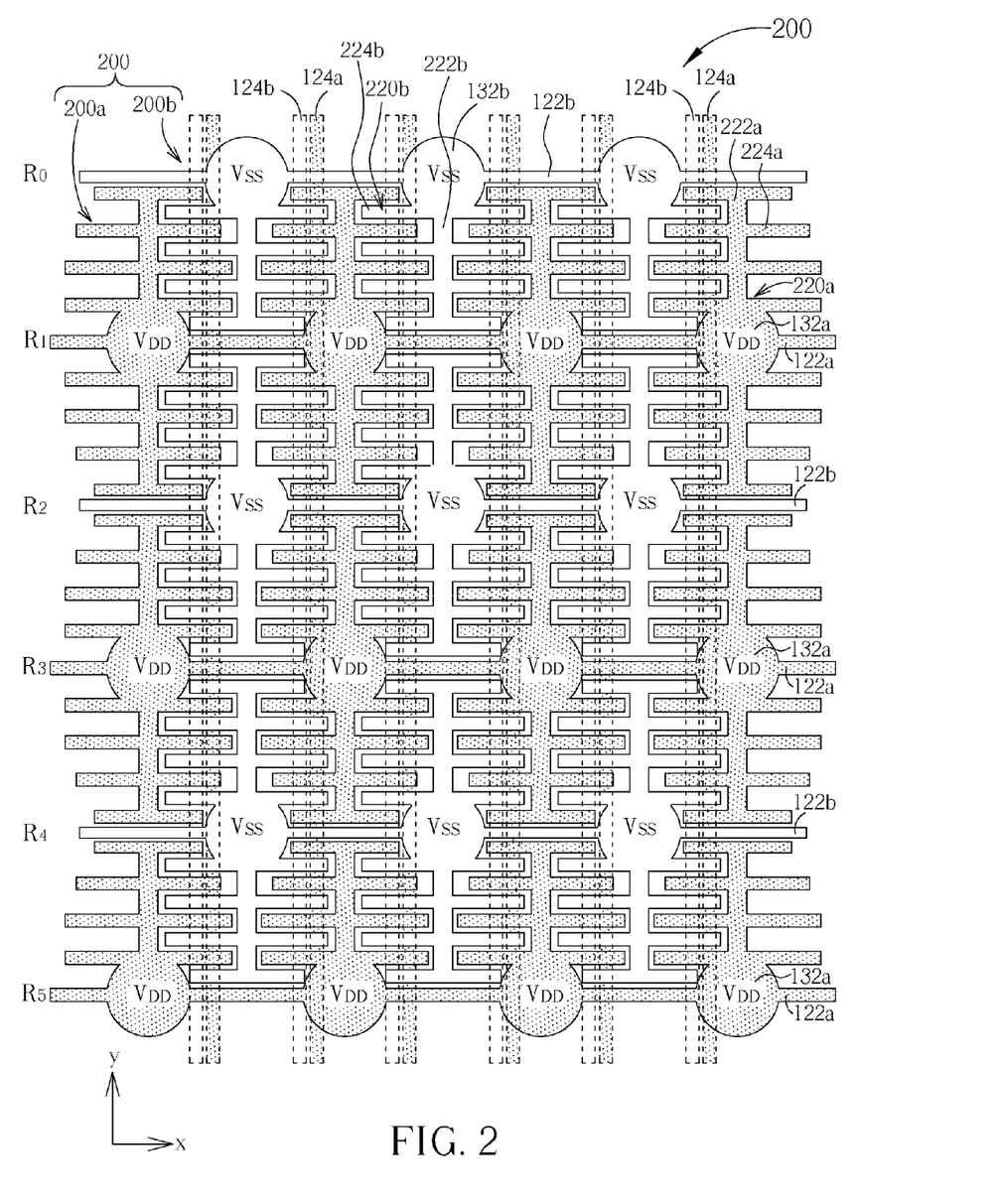
FIG. 2 is a schematic, partial plan view showing a power/ground plane structure or power/ground interconnection network in an IC chip according to one embodiment of this invention.

FIG. 2 is a schematic, partial plan view showing a power/ground plane structure or power/ground interconnection network in an IC chip according to one embodiment of this invention. As shown in FIG. 2, the power/ground interconnection network 200 fabricated at least in the topmost metal layer. The power/ground interconnection network 200 includes interleaved power network 200a and ground network 200b, wherein the power network 200a is indicated in shadow region.

The power network 200a includes rows of first power lines such as horizontal power lines 122a, which extends along the reference x-axis. For sake of simplicity, only several rows (R1, R3 and R5) of the first power lines 122a are illustrated in FIG. 2. A plurality of $V_{DD}$ bump sites or $V_{DD}$ bump pads 132a for bumping such as flip chip bumping can be disposed along the first power lines 122a. According to the embodiment of the invention, the first power lines 122a can be formed in the redistribution layer (RDL) or any other topmost metal layer, and the $V_{DD}$ bump pads 132a can be formed on or over the redistribution layer (RDL) or any other topmost metal layer.

The redistribution layer may be an aluminum layer, a copper layer or layer made of any other metal overlying a passivation layer.

The ground network 200b includes rows of first ground lines such as horizontal ground lines 122b, which also extends along the reference x-axis. In this embodiment, the rows of first power lines 122a and the rows of first ground lines 122b are arranged alternately one by one. For sake of simplicity, only several rows (R0, R2 and R4) of the first ground lines 122b are illustrated in FIG. 2. A plurality of $V_{SS}$ bump sites or $V_{SS}$ bump pads 132b for bumping such as flip chip bumping can be disposed along the first ground lines 122b. According to the embodiment of the invention, the first ground lines 122b can be formed in the RDL or any other topmost metal layer, and the $V_{SS}$ bump pads 132b can be formed on or over the RDL or any other topmost metal layer. The $V_{DD}$ bump pads 132a and the $V_{SS}$ bump pads 132b can be arranged in a staggered manner.

According to the embodiment of the invention, each of the $V_{DD}$ bump pads 132a is connected to at least an extension portion such as a fishbone-shaped extension portion 220a including a connection portion such as a bar-shaped connection portion 222a that protrudes from the $V_{DD}$ bump pads 132a and elongates in a direction that is parallel to the underlying second power lines such as longitudinal power lines 124a and second ground lines such as longitudinal ground lines 124b. The underlying second power lines 124a and second ground lines 124b are fabricated in the lower interconnection metal layer, for example, M6, that is one level lower than the RDL in this exemplary embodiment. The second power lines 124a and second ground lines 124b may extend along the reference y-axis. According to the embodiment of the invention, the extension portion 220a is substantially orthogonal to the first power lines 122a. The $V_{DD}$ bump pads 132a may be connected to two opposite extension portions 220a and the two opposite extension portions 220a may be mirror-symmetric to each other with respect to the power line 122a.

In another embodiment of this invention, the second power lines 124a and second ground lines 124b occupy a relatively small area in M6, for example, 10% or 5% of M6. In yet another embodiment of this invention, the second power lines 124a and second ground lines 124b in M6 may be omitted and the entire M6 layer can be spared for signal routing. That is, the power/ground interconnection network 200 can be fabricated only in the topmost metal layer (or RDL) in the IC chip according to another embodiment, thus allow more space for signal routing.

Still referring to FIG. 2, the extension portion 220a can further include a plurality of fingers 224a connected to the connection portion 222a. According to the embodiment of the invention, the fingers 224a protrude from two opposite side edges of the connection portion 222a and elongate in the reference x-axis direction that is parallel to the first power lines 122a.

Likewise, each of the $V_{SS}$ bump pads 132b is connected to at least an extension portion such as a fishbone-shaped extension portion 220b including a connection portion such as a bar-shaped connection portion 222b that protrudes from the $V_{SS}$ bump pads 132b and elongates in a direction that is parallel to the underlying second power lines 124a and second ground lines 124b. According to the embodiment of the invention, the extension portion 220b is substantially orthogonal to the first ground lines 122b. The $V_{SS}$ bump pads 132b may be connected to two opposite extension portions 220b and the two opposite extension portions 220b may be mirror-symmetric to each other with respect to the ground line 122b.

The extension portion 220b can further include a plurality of fingers 224b connected to the connection portion 222b. According to the embodiment of the invention, the fingers 224b protrudes from two opposite side edges of the connection portion 222b and elongates in the reference x-axis direction that is parallel to the first ground lines 122b. According to the embodiment of the invention, the fingers 224b interdigitate with the fingers 224a. The interdigitated fingers 224a and 224b may generate extra coupling capacitance between the power network 200a and the ground network 200b. This extra coupling capacitance between the power network 200a and the ground network 200b helps stabilize the power signal and reduce dynamic IR drop over the chip.

Figure 3A:
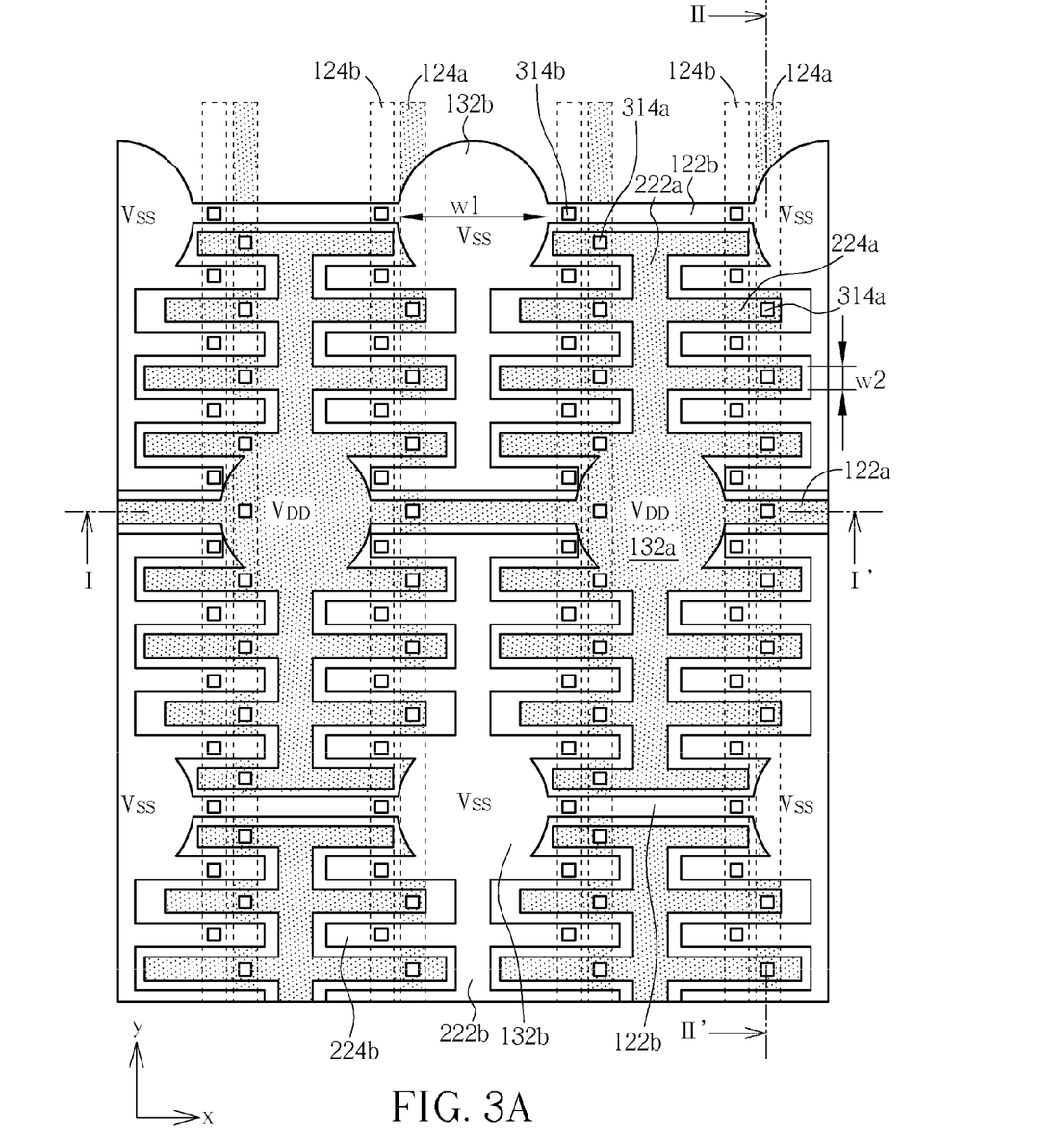
FIG. 3A is an enlarged partial plan view of the power/ground interconnection network in FIG. 2.
Figure 3B:
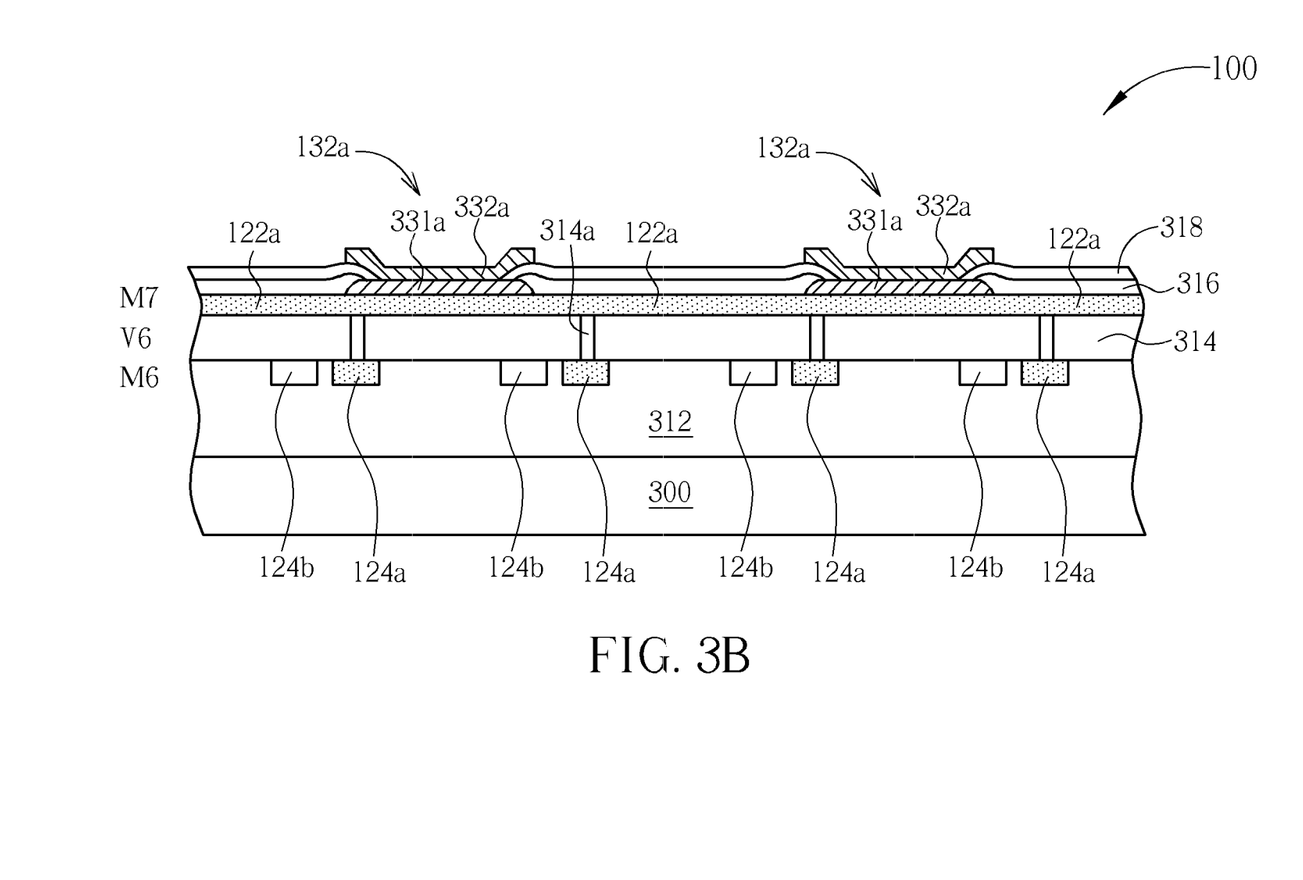
FIG. 3B is a schematic, cross-sectional view taken along line I-I' in FIG. 2.
Figure 3C:
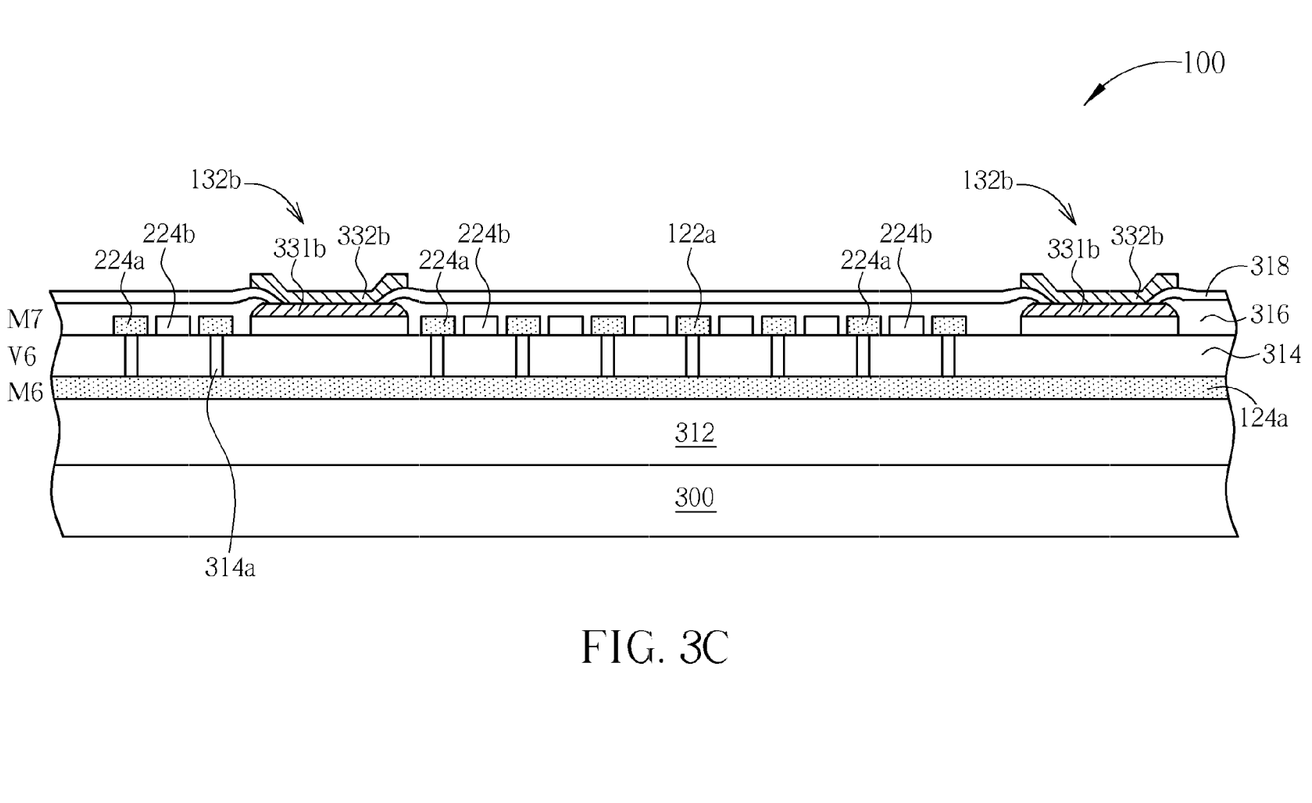
FIG. 3C is a schematic, cross-sectional view taken along line II-II' in FIG. 2.

Please refer briefly to FIG. 3A to FIG. 3C. FIG. 3A is an enlarged partial plan view of the power/ground interconnection network 200 in FIG. 2. FIG. 3B is a schematic, cross-sectional view taken along line I-I' in FIG. 2. FIG. 3C is a schematic, cross-sectional view taken along line II-II' in FIG. 2. In accordance with one embodiment of this invention, the bump pads 132a and 132b can have a bump size $w_1$ ranging between about 80 micrometers and about 120 micrometers, for example, 100 micrometers. However, the bump size can vary with different design requirements. The fingers 224a and 224b can have a line width $w_2$ ranging between about 4 micrometers and about 10 micrometers. As shown in FIGS. 3A-3C, the fingers 224a can be electrically coupled to the underlying second power line 124a by means of a conductive via or via plug 314a. The fingers 224b can be electrically coupled to the underlying second ground line 124b by means of a conductive via or via plug 314b.

As shown in FIGS. 3B and 3C, the power/ground interconnection network 200 is fabricated at least in the topmost metal layer, for example, M7 or RDL, in an IC chip 100. In accordance with one embodiment of this invention, the IC chip 100 includes a semiconductor substrate 300 having thereon a plurality of circuit elements (not shown) such as transistors, fuse, capacitors or the like. At least an interlayer dielectric (ILD) 312 can be formed overlying the semiconductor substrate 300. The ILD 312 may include dielectric stack comprised of various dielectric materials such as silicon oxide, silicon nitride, silicon oxynitride, silicon carbide, polyimide, low-k dielectric, extra-low k dielectric or ultra low k dielectric known in the art. Interconnection metal layers (only M6, V6 and M7 are shown for the sake of simplicity) can be fabricated, for example, in the ILD 312 and the dielectric layers 314 and 316. For example, the second power line 124a and the second ground line 124b can be in M6. The dielectric layer 314 can be formed overlying the ILD 312 and covers the second power line 124a and the second ground line 124b. The dielectric layer 316 may be a passivation layer such as silicon nitride, silicon oxide or any other suitable dielectrics. A dielectric layer such as a polyimide layer 318 may be formed over the dielectric layer 316. The power network 200a and the ground network 200b can be in M7. The bump pads 132a and 132b, which may respectively include a conductive pad layer 331a and 331b on the topmost metal layer (ex. aluminum RDL layer (M7)) and an UBM (under bump metallurgy) layer 332a or 332b, for example, can be exposed through an opening formed in the passivation layer 316 and the dielectric layer 318 that cover the power network 200a and the ground network 200b.

Figure 4:
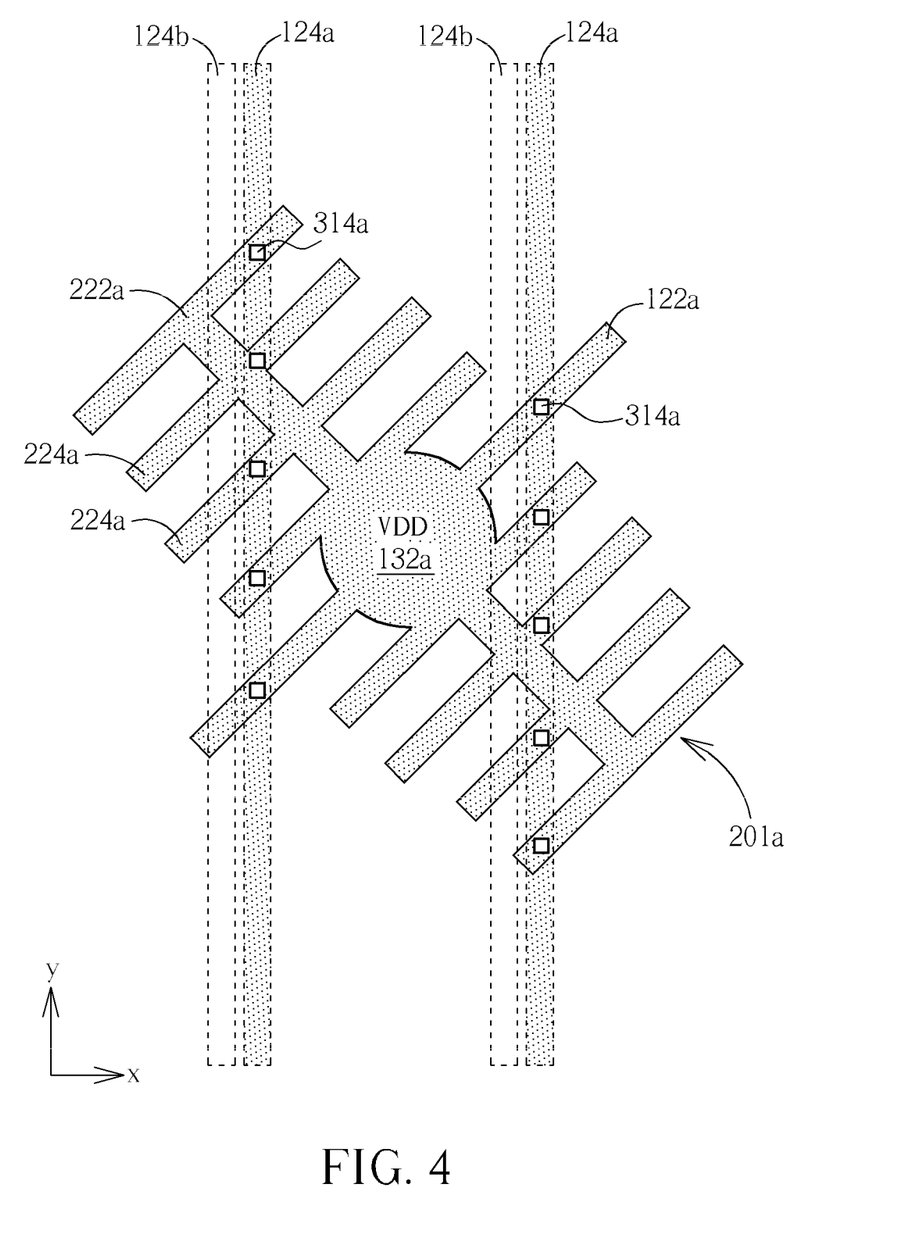
FIG. 4 is a schematic, partial plan view showing another embodiment of this invention.

FIG. 4 is a schematic, partial plan view showing another embodiment of this invention, wherein like numeral numbers designate like elements, regions or layers. For the sake of simplicity, only a unit pattern such as a fishbone-shaped unit pattern 201a of the power network 200a in the topmost metal layer is demonstrated. It is to be understood that the power network 200a can consist of an array of the unit patterns 201a. As shown in FIG. 4, the unit pattern 201a is rotated about 45 degrees in a counterclockwise direction about the center of the VDD bump pad 132a. In other embodiments, a rotation of the some other degrees may be implemented and the unit pattern 201a may be rotated in a clockwise direction.

Figure 5:
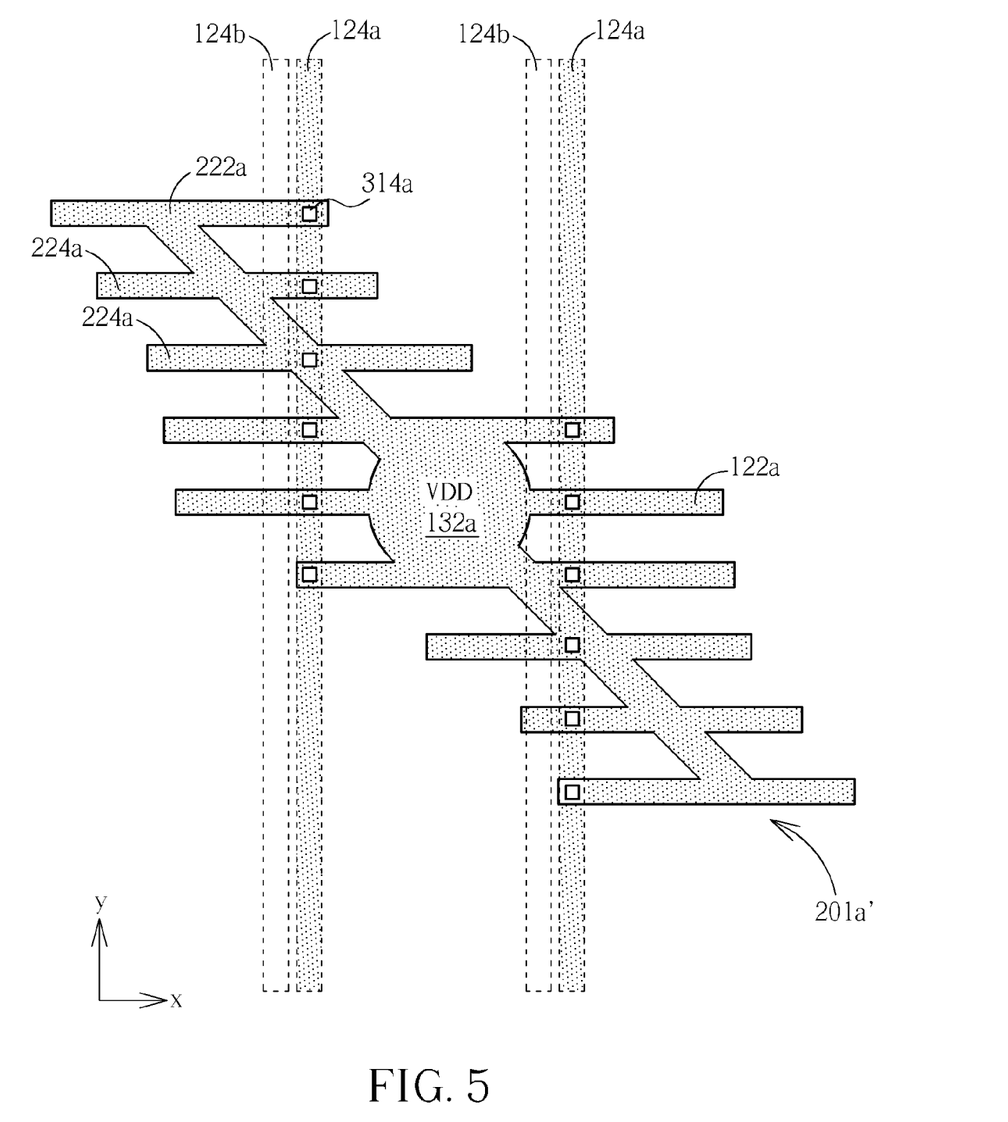
FIG. 5 is schematic, partial plan view showing a variant of FIG. 4 in accordance with still another embodiment of this invention.

FIG. 5 is schematic, partial plan view showing a variant of FIG. 4 in accordance with still another embodiment of this invention. As shown in FIG. 5, a unit pattern such as fishbone-shaped unit pattern 201a' of the power network 200a in the topmost metal layer can have a rotated connection portion 222a, which is not parallel to the underlying second power lines 124a and second ground lines 124b. The difference between FIG. 4 and FIG. 5 is that the fingers 224a and the first power lines 122a in FIG. 5 extend along the reference x-axis.

Those skilled in the art will readily observe that numerous modifications and alterations of the device and method may be made while retaining the teachings of the invention.

What is claimed is:

1. An integrated circuit chip comprising:
a semiconductor substrate;
a power/ground interconnection network in a topmost metal layer over the semiconductor substrate; and
at least a bump pad on/over the power/ground interconnection network;
wherein the power/ground interconnection network comprises a first power/ground line connected to the bump pad and extending along a first direction, and a connection portion connected to the bump pad and extending along a second direction; wherein a plurality of fingers protrude from the connection portion.

2. The integrated circuit chip according to claim 1 wherein the first direction is not parallel to the second direction.

3. The integrated circuit chip according to claim 1 wherein the first direction is substantially orthogonal to the second direction.

4. The integrated circuit chip according to claim 1 wherein the fingers protrude from two opposite side edges of the connection portion and elongate in the first direction.

5. The integrated circuit chip according to claim 1 further comprising a second power/ground line in an underlying metal layer.

6. The integrated circuit chip according to claim 5 wherein the second power/ground line extends along the second direction.

7. The integrated circuit chip according to claim 5 wherein the second power/ground line is connected to at least one of the plurality of fingers by means of at least one via plug.

8. The integrated circuit chip according to claim 1 wherein the power/ground interconnection network comprises a power network and a ground network, and the power network and the ground network are interleaved.

9. The integrated circuit chip according to claim 1 wherein the bump pad is a flip chip bump pad.

10. An integrated circuit chip comprising:
a semiconductor substrate;
a bump pad on or over a topmost metal layer over the semiconductor substrate;
a first power/ground line in the topmost metal layer, connected to the bump pad and extending along a first direction; and
at least an extension portion in the topmost metal layer, connected to the bump pad and extending along a second direction;

wherein the extension portion comprises a connection portion that protrudes from the bump pad and extends along the second direction; and wherein the extension portion further comprises a plurality of fingers protruding from the connection portion.

11. The integrated circuit chip according to claim 10 wherein the fingers protrude from two opposite side edges of the connection portion and elongate in the first direction.

12. The integrated circuit chip according to claim 10 further comprising a second power/ground line in an underlying metal layer.

13. The integrated circuit chip according to claim 12 wherein the second power/ground line extends along the second direction.

14. The integrated circuit chip according to claim 12 wherein the second power/ground line is connected to at least one of the plurality of fingers by means of at least one via plug.

15. The integrated circuit chip according to claim 10 wherein the bump pad is a flip chip bump pad.

16. The integrated circuit chip according to claim 10 wherein the topmost metal layer is a redistribution layer.

* * * * *